(12) United States Patent
Noguchi

(10) Patent No.: US 7,323,893 B2
(45) Date of Patent: Jan. 29, 2008

(54) PROBE DEVICE CAPABLE OF BEING USED FOR PLURAL KINDS OF TESTERS

(75) Inventor: Masayuki Noguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/522,984

(22) Filed: Sep. 19, 2006

(65) Prior Publication Data

US 2007/0007979 A1   Jan. 11, 2007

Related U.S. Application Data

(63) Continuation of application No. PCT/JP2005/004698, filed on Mar. 16, 2005.

(30) Foreign Application Priority Data

Mar. 19, 2004 (JP) .............................. 2004-079510

(51) Int. Cl.
*G01R 31/02* (2006.01)
*G01R 31/28* (2006.01)

(52) U.S. Cl. .................................. 324/754; 324/158.1

(58) Field of Classification Search ................ 324/754, 324/755, 758, 761, 762, 765, 158.1
See application file for complete search history.

(56) References Cited

U.S. PATENT DOCUMENTS

| | | | | |
|---|---|---|---|---|
| 5,068,601 A | * | 11/1991 | Parmenter | ................. 324/754 |
| 6,104,202 A | * | 8/2000 | Slocum et al. | ............... 324/758 |
| 6,114,869 A | * | 9/2000 | Williams et al. | ............ 324/765 |
| 6,118,290 A | * | 9/2000 | Sugiyama et al. | .......... 324/754 |
| 6,166,553 A | * | 12/2000 | Sinsheimer | ................. 324/754 |

FOREIGN PATENT DOCUMENTS

| | | |
|---|---|---|
| JP | 63-299243 A | 12/1988 |
| JP | 64-053428 A | 3/1989 |
| JP | 2000-349128 A | 12/2000 |

* cited by examiner

*Primary Examiner*—Ha Tran Nguyen
*Assistant Examiner*—Roberto Velez
(74) *Attorney, Agent, or Firm*—Oblon, Spivak, McClelland, Maier & Neustadt, P.C.

(57) ABSTRACT

A probe device includes a tester; a probe card; a base card holder; an auxiliary card holder for adaptively mounting the probe card to the base card holder; and a conversion ring for allowing the auxiliary card holder to be fitted to the base card holder. In the probe device, the base card holder is configured to accommodate any one of selected different conversion rings and the conversion ring is the one chosen from the different conversion rings according to the probe card.

12 Claims, 7 Drawing Sheets

PROBE DEVICE CAPABLE OF BEING USED FOR PLURAL KINDS OF TESTERS

This application is a Continuation Application of PCT International Application No. PCT/JP2005/004698 filed on 16 Mar. 2005, which designated the United States.

FIELD OF THE INVENTION

The present invention relates to a probe device capable of being used for plural kinds of testers; and, more particularly, to a probe device which enables plural kinds of testers to be provided with exclusive connecting rings and probe cards.

BACKGROUND OF THE INVENTION

A probe device is used for inspecting electrical characteristics of semiconductor devices formed on a wafer during a manufacturing process of those devices. As shown in FIG. 8, an exemplary probe device includes a loader chamber 1 for loading a wafer W and a prober chamber 2 for inspecting electrical characteristics of the wafer W conveyed from the loader chamber 1. Further, the prober chamber 2 includes: a mounting table (main chuck) 3 accommodating therein an elevating mechanism, for mounting thereon the wafer W conveyed from the loader chamber 1; an XY table 4 for moving the main chuck 3 in X and Y directions; a probe card 5 arranged above the main chuck 3; a card supporting mechanism (hereinafter, referred to as 'clamp mechanism') (not shown) for supporting the probe card 5, the probe card 5 capable of being detachably attached to the clamp mechanism; and a position alignment mechanism 6 for precisely aligning a plurality of probe pins 5A of the probe card 5 to a plurality of electrode pads of the wafer W mounted on the main chuck 3. The alignment mechanism 6 includes an upper camera 6A for monitoring the wafer W and a lower camera 6B for monitoring the probe pins 5A, the lower camera 6B being attached to the main chuck 3.

As illustrated in FIG. 8, a head plate 7 is installed on a top surface of the prober chamber 2. The clamp mechanism for supporting the probe card 5 is installed at an opening of the head plate 7. The probe card 5 can be detachably attached to the clamp mechanism. Further, a test head TH of a tester T is rotatably disposed on the head plate 7 and is electrically connected with the probe card 5 via a connecting ring (pogo ring) 8. Inspection signals are sent from the tester T to the probe pins 5A via the test head TH, a performance board and the pogo ring 8. By applying the inspection signals from the probe pins 5A to the electrode pads of the wafer W, the electrical characteristics of a plurality of semiconductor devices formed on the wafer W can be inspected.

Since inspection items, the number of electrode pads and an arrangement pattern thereof vary depending on types of the devices, different testers are employed adaptively to the devices. Further, the testers respectively have exclusive test heads TH and performance boards. Meanwhile, the probe device is provided with the probe card 5 and the pogo ring 8 for use in a specific tester. The pogo ring 8 serves to electrically connect the probe card 5 to the performance board of the tester.

As described above, probe devices and testers are in one-to-one relationship. A conventional probe device can only be electrically connected to a specific tester. In order to connect a probe device adapted to a specific tester to a different tester, it is necessary to prepare the probe card 5 and the pogo ring 8 corresponding to a performance board of the different tester. Since, however, the pogo ring 8 has different pogo pin number, pin arrangement and exterior shape depending for a different testers, a design of an insert ring and/or a clamp mechanism needs to be changed according to the pogo ring 8 and the probe card 5, which necessitates a great modification of a connecting structure. Especially, because device has become diverse along with a recent trend for a diversification of semiconductor devices, various kinds of testers and probe devices are needed.

Japanese Patent Laid-open Application No. 2000-349128 discloses therein a probe device employing an adaptor ring inserted between a pogo ring and an inner ring. In such a probe device, the change of tester can be accommodated by changing the adapter ring. Even in case the tester is changed through the use of the adaptor ring, the same inner ring can be used in the probe device.

Further, referring to Japanese Patent Laid-open Application No. 2000-349128, there is disclosed a connecting structure between a probe device side and a tester side. However, the device disclosed therein is unable to be used for plural kinds of probe cards having different diameters. A currently available probe device can be used for a probe card having a diameter up to 350 mm. However, the probe card is being scaled up recently, the connecting structure disclosed therein is unable to be used for a scaled-up probe card or plural kinds of probe cards, although it can be used for plural kinds of testers.

SUMMARY OF THE INVENTION

It is, therefore, an object of the present invention to provide a probe device capable of overcoming at least one of the aforementioned drawbacks.

In accordance with the present invention, there is provided a probe device capable of being used for a scaled-up probe card and plural kinds of probe cards, the probe device including a tester; a probe card; a base card holder; an auxiliary card holder for adaptively mounting the probe card to the base card holder; and a conversion ring for allowing the auxiliary card holder to be fitted to the base card holder. The base card holder is configured to accommodate any one of selected different conversion rings and the conversion ring is the one chosen from the different conversion rings according to the probe card.

It is preferable that the auxiliary card holder includes a plurality of protrusions formed therearound, and the conversion ring includes a plurality of one-touch fixing mechanisms for fixing the plurality of protrusions of the auxiliary card holder.

It is preferable that each of the plurality of one-touch fixing mechanisms has a pressing member for pressing the corresponding protrusion and an axial member for supporting the pressing member to rotate freely.

It is preferable that each of the plurality of one-touch fixing mechanisms further has an elastic member for pressurizing the pressing member in a downward direction.

It is preferable that each of the plurality of one-touch fixing mechanisms further has positioning mechanisms for determining a position where the pressing member is fixed.

It is preferable that the probe device further includes a connecting ring for electrically connecting the tester with the probe card; an insert ring; and an inner ring for adaptively mounting the connecting ring to the insert ring. The insert ring is configured to accommodate any one of selected different inner rings and the inner ring is the one chosen from the different inner rings according to the connecting ring.

It is preferable that the inner ring includes a positioning mechanism for vertically positioning the probe card exclusively for use in the tester.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

In accordance with a preferred embodiment of the present invention, there is provided a probe device capable of being used for a scaled-up probe card.

In accordance with another preferred embodiment of the present invention, there is provided a probe device capable of being used for plural kinds of probe cards.

Figure 1:
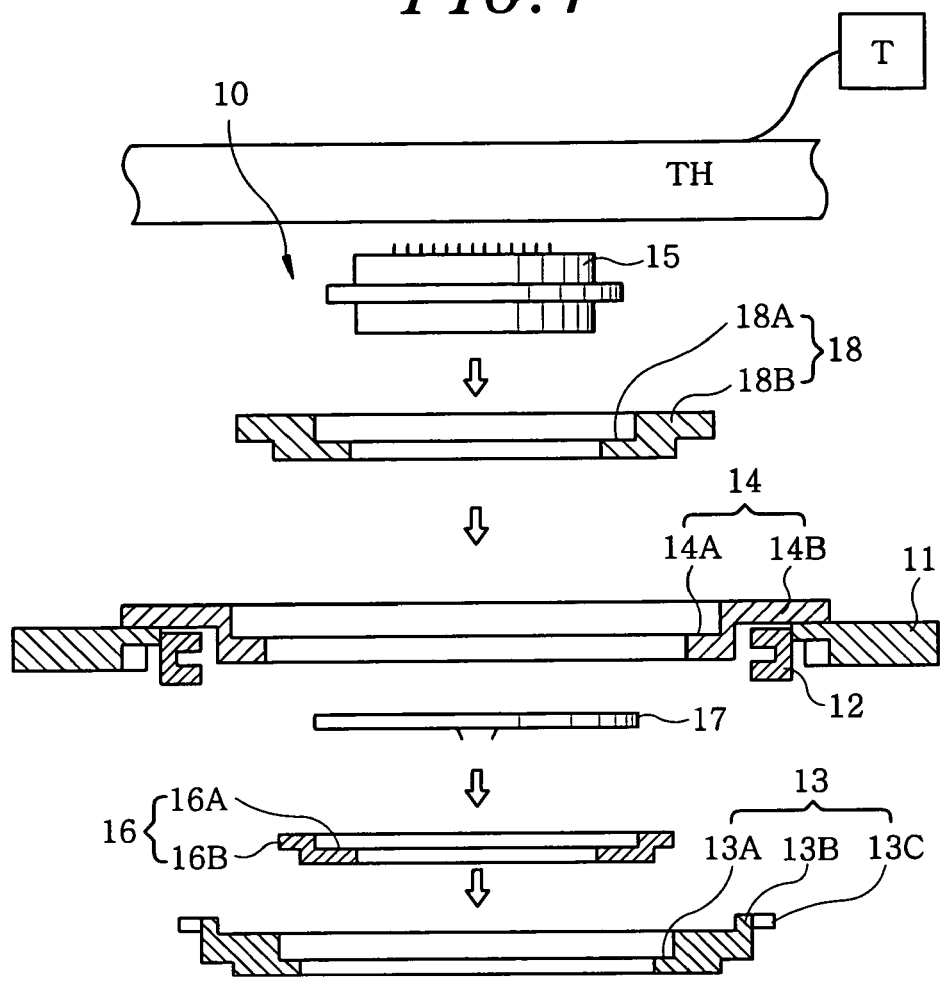
FIG. 1 is an exploded sectional view of principal parts of a probe device in accordance with a preferred embodiment of the present invention.

Hereinafter, those preferred embodiments of the present invention will be described in detail with reference to FIGS. 1 to 7. A probe device of this embodiment is configured such that plural kinds of probe cards can be attached thereto. Referring to FIG. 1, there is illustrated an exemplary probe device 10 of this embodiment. The probe device can include a clamp mechanism 12 installed at a central opening of a head plate 11, a primary card holder 13 installed at the clamp mechanism 12 and an insert ring 14 installed at an opening of the head plate 11. The primary card holder 13 can be detached from the clamp mechanism 12. The clamp mechanism 12 and the primary card holder 13 can be formed to have a size capable of accommodating scaled-up probe card and plural kinds of probe cards having different outer diameters. The insert ring 14 is configured such that each of plural kinds of testers T can be provided with an exclusive connecting ring (e.g., pogo ring) 15.

In other words, as shown in FIG. 1, the primary card holder 13 can be formed as a wide ring plate whose lower portion of inner peripheral surface has a reducible diameter. Further, the primary card holder 13 can include: a receiving portion 13A for supporting a conversion ring (to be described later) at a flange portion of the conversion ring; a wall 13B upwardly extending from an entire outer peripheral portion of a top surface of the ring plate; and a plurality of radial protruding portions 13C spaced from each other at specific intervals along a circumferential direction of an upper portion of the wall 13B. Moreover, the primary card holder 13 is secured in place by the clamp mechanism 12 via the plurality of protruding portions 13C.

A scaled-up probe card is directly installed with respect to the receiving portion 13A of the primary card holder 13. Meanwhile, a probe card attached with a card holder is installed with respect to the receiving portion 13A of the primary card holder 13 via a conversion ring 16.

Thus, as shown in FIG. 1, since the conversion ring 16 has a function of converting an outer diameter of the probe card 17, the probe card 17 can be installed at the primary card holder 13 by using the conversion ring 16. Further, the probe card 17 and a card holder 20 thereof (see FIG. 3) vary depending on devices formed on the wafer W and, therefore, an exclusive conversion ring 16 is needed for each of the plurality of the testers according to the probe card 17 and/or the card holder.

The conversion ring 16 can have a structure corresponding to an exterior shape of the probe card 17. FIG. 1 shows an example of the conversion ring 16 employing a structure of a ring shaped plate whose inner peripheral surface has a reduced diameter. Moreover, the conversion ring 16 includes a receiving portion 16A for supporting the card holder 20 (see FIG. 3); and a flange portion 16B extended from an outer peripheral surface of the ring shaped plate. The flange portion 16B is engaged with the receiving portion 13A of the primary card holder 13.

Accordingly, in case the probe card 17 is installed at the primary card holder 13, the probe card 17 attached with the card holder 20 (see FIG. 3) is installed at the conversion ring 16 as indicated by an arrow of FIG. 1, and, then, the conversion ring 16 is installed at the primary card holder 13. Next, an integrated unit of the probe card 17, the conversion ring 16 and the primary card holder 13 are transferred directly under the clamp mechanism 12 via a transfer mechanism (not shown). As indicated by an arrow of FIG. 2, in a state where the integrated unit is lifted, the probe card 17 is fixed to the probe device 10 by securing the primary card holder 13 with the clamp mechanism 12.

Meanwhile, as illustrated in FIG. 1, the insert ring 14 has a ring-shaped structure. A lower diameter of an inner peripheral surface of the insert ring 14 is reduced, thereby forming a receiving portion 14A. In the meantime, an upper diameter of the insert ring 14 is enlarged, thereby forming a flange portion 14B. The flange portion 14B of the insert ring 14 is fixed to the head plate 11 by using a clamping member such as screws or the like. Further, if necessary, an inner ring 18 can be installed at the receiving portion 14A of the insert ring 14. Herein, the inner ring 18 can have a structure corresponding to the pogo ring 15 for use in plural kinds of testers.

Further, as illustrated in FIG. 1, the inner ring 18 can have a ring-shaped structure. A diameter of an inner peripheral surface of the inner ring 18 is reduced, thereby forming a receiving portion 18A. Meanwhile, an upper diameter of an outer peripheral surface thereof is enlarged, thereby forming a flange portion 18B. The flange portion 18B can be configured to be engaged with the receiving portion 14A of the insert ring 14. Therefore, in case, among plural kinds of pogo rings, a pogo ring 15 corresponding to a tester T is installed at the insert ring 14, the inner ring 18 is first installed at the insert ring 14, as indicated by an arrow of FIG. 1. Thereafter, the corresponding pogo ring 15 can be installed at the inner ring 18.

Hereinafter, the primary card holder, the conversion ring and the probe card (see FIG. 1) will be described in detail with reference to FIGS. 3 and 4. As described above, the primary card holder 13 can include the receiving portion 13A, the wall 13B and the plurality of protruding portions 13C. Further, the conversion ring 16 can include the receiving portion 16A and the flange portion 16B, as described above. As can be seen from FIG. 3, a top surface of the receiving portion 13A of the primary card holder 13 can be provided with two (or at least three) positioning projections 13D spaced apart from each other at 180 degrees along a circumferential direction. By inserting the positioning projections 13D into positioning holes 16C formed at the flange portion 16B of the conversion ring 16, the position of the conversion ring 16 is fixed on the primary card holder 13. Further, the receiving portion 13A of the primary card holder 13 and the flange portion 16B of the conversion ring 16 are fixed by a plurality of screw members 19.

Figure 3:
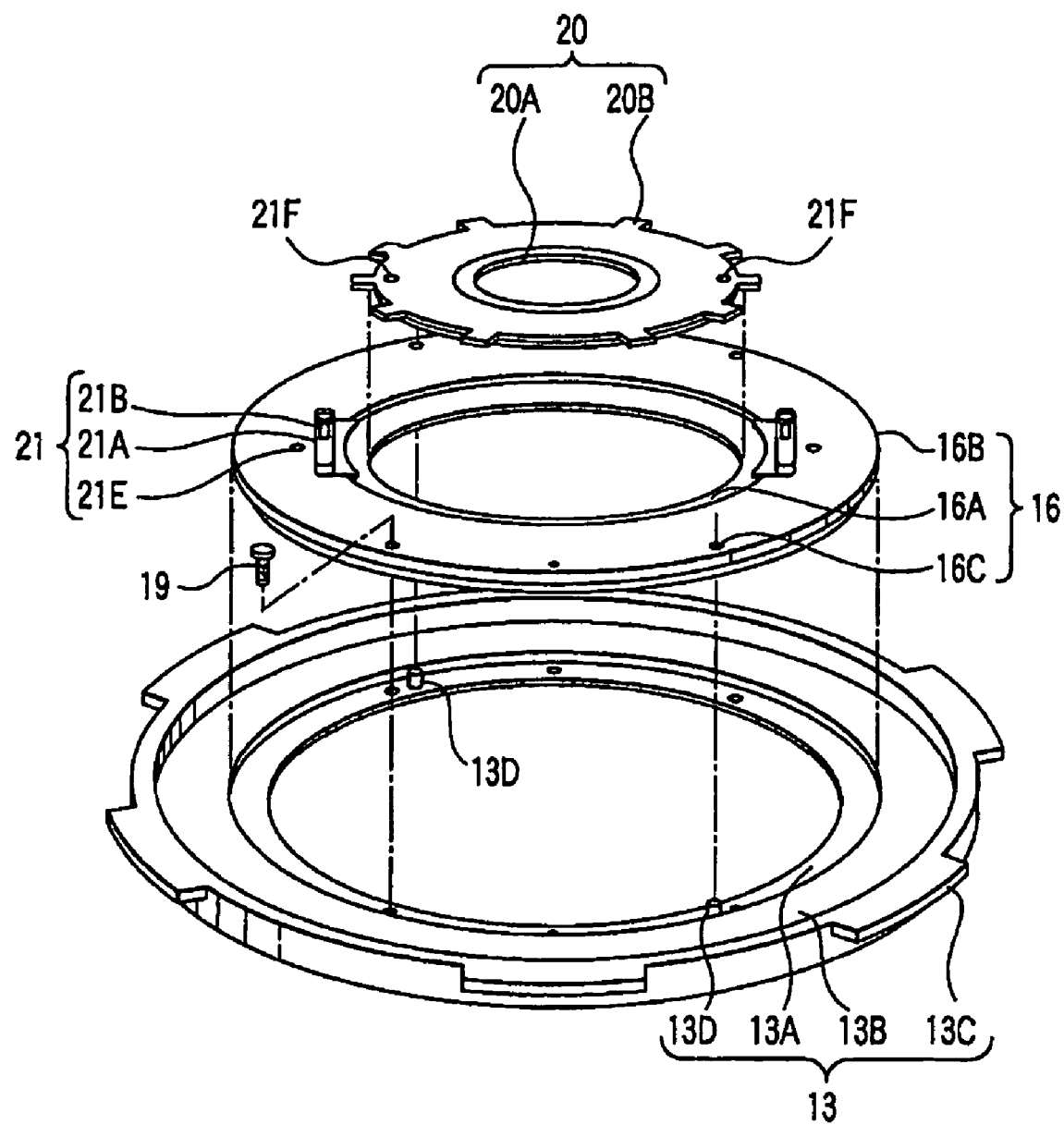
FIG. 3 provides an exploded perspective view of a base card holder, a conversion ring and a card holder used in the probe device of FIG. 1.

The probe card 17 (not shown) is installed at the conversion ring 16 via the card holder 20 shown in FIG. 3. The card holder 20 can have a ring shaped structure, as illustrated in FIG. 3. Further, a lower diameter of an inner peripheral surface of the card holder 20 is reduced, thereby forming a receiving portion 20A. Meanwhile, a plurality of protruding portions 20B can be radially formed at an upper portion of an outer peripheral surface. The conversion ring 16 is engaged with the protruding portions 20B, and the receiving portion 16A of the conversion ring 16 supports the card holder 20.

As shown in FIG. 3, the conversion ring 16 can have two one-touch fixing mechanisms 21, for example. Further, the card holder 20 is fixed on the conversion ring 16 by the one-touch fixing mechanisms 21. The mechanisms 21 are spaced apart from each other at 180 degrees on the flange portion 16B of the conversion ring 16 along a circumferential direction.

Figure 4A:
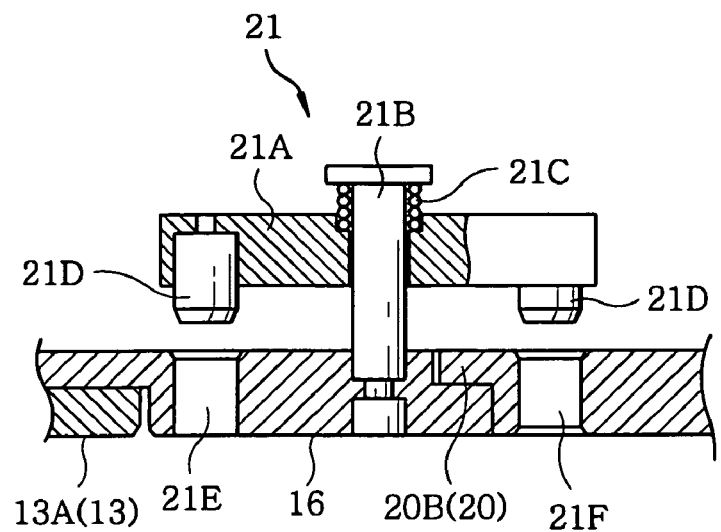
FIG. 4A presents a sectional view illustrating a state right before the card holder is fixed by the conversion ring of FIG. 3.
Figure 4B:
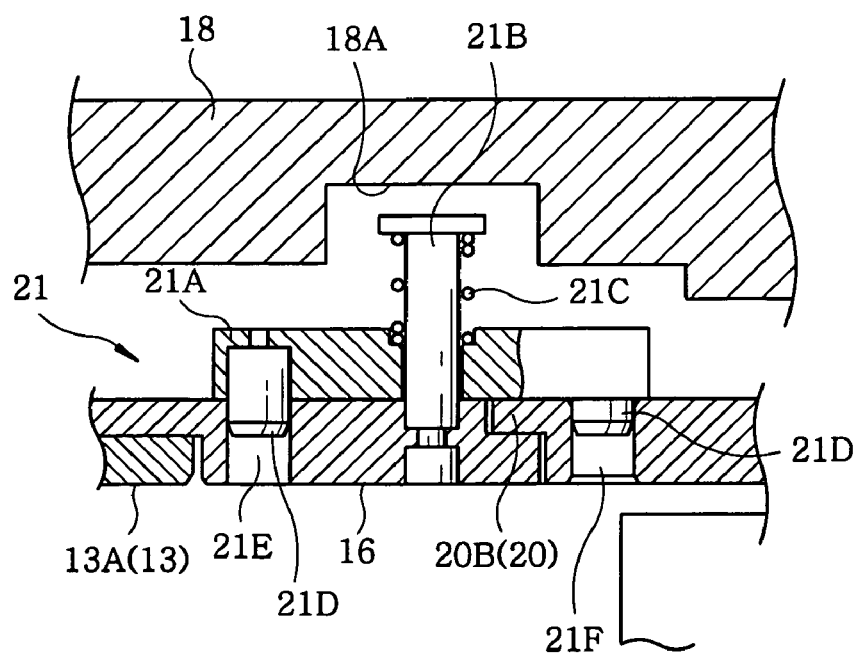
FIG. 4B represents a sectional view depicting a state where the card holder is fixed by the conversion ring of FIG. 3.

Besides, as illustrated in FIGS. 4A and 4B, each of the one-touch fixing mechanisms 21 can include: a pressing member 21A for pressing the protruding portion 20B of the card holder 20; an upright axial member 21B installed at an inner peripheral portion of the conversion ring 16 through a hole formed at a central portion of the pressing member 21A; and coil spring 21C elastically provided between a flange portion formed at an upper portion of the axial member 21B and the pressing member 21A. The pressing member 21A can have a rectangular sectional shape. The coil spring 21C constantly pressurizes the pressing member 21A in a downward direction. A lower portion of the coil spring 21C can be inserted into a ring shaped recess portion surrounding a hole of the pressing member 21A. Further, a pair of positioning protrusions 21D can be attached to bottom surfaces of both end portions of the pressing member 21A. Respectively formed on a top surface of the conversion ring 16 and that of a protruding portion 20B of the card holder 20 are a pair of first positioning recesses 21E and 21F where the protrusions 21D are inserted. Further, a pair of second recesses (not shown) where the protrusions 21D of the pressing member 21A are inserted can be formed on a top surface of the conversion ring 16 along a circumferential direction about the axial member 21B. A line for connecting the first recesses 21E and 21F is perpendicular to a line for connecting the second recesses.

As illustrated in FIG. 3, in case the conversion ring 16 is not used, the protrusions 21D of the pressing members 21A of the one-touch fixing mechanisms 21 are inserted into the second recesses formed on the top surface of the flange portion 16B. On the other hand, in case the conversion ring 16 is used, the pressing member 21A of the one-touch fixing mechanism 21 is lifted by the axial member 21B against an elastic force of the coil spring 21C and then rotated at an angle of 90 degrees. Accordingly, the pressing member 21A is disposed to pass across a boundary of the conversion ring 16 and the card holder 20, as shown in FIG. 4A. If the pressing member 21A is released in such state, the pressing member 21A is moved downward by a pressurizing force of the coil spring 21C, as depicted in FIG. 4B. Then, the protrusions 21D are inserted into the first recesses 21E and 21F, so that the card holder 20 is fixed by the pressurization of the conversion ring 16. Besides, as shown in FIG. 4B, recesses 18A where upper portions of the axial members 21B are inserted can be formed on a bottom surface of the inner ring 18.

In case the probe card 17 of this embodiment is installed at the probe device 10, first of all, the probe card 17 is installed at the card holder 20 shown in FIG. 3 and, then, the card holder 20 is installed at the conversion ring 16. At this time, the protruding portions 20B of the card holder 20 are positioned to face the one-touch fixing mechanisms 21 of the conversion ring 16. Thereafter, the pressing members 21A of the one-touch fixing mechanisms 21 are lifted and rotated at an angle of 90 degrees, thereby aligning the protrusions 21D with the first recess 21E of the flange portion 16B and the first recess 21F of the protruding portions 20B. Then, the probe card 17 is fixed on the conversion ring 16 by the pressing members 20A.

Figure 2:
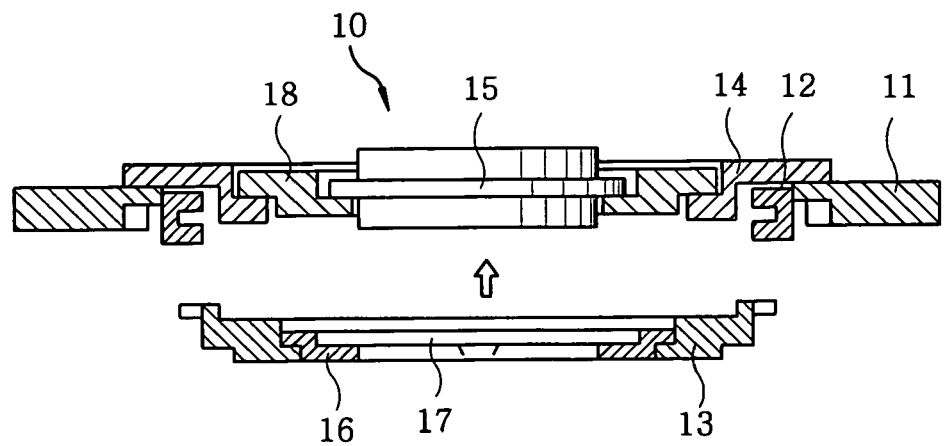
FIG. 2 shows a sectional view illustrating a state where components of FIG. 1 are installed at the probe device.

Next, as shown in FIG. 3, the positioning holes 16C of the conversion ring 16 are aligned with the positioning projections 13D of the primary card holder 13 and, then, the conversion ring 16 is installed at the primary card holder 13. By clamping the primary card holder 13 and the conversion ring 16 with screws, the probe card is attached to the primary card holder 13. Thereafter, as illustrated in FIG. 2, the probe card is transferred to the position directly under the clamp mechanism 12 by a card holder transfer mechanism (not shown). As indicated by an arrow of FIG. 2, in a state where the probe card is lifted, the protruding portions 13C of the primary card holder 13 are inserted into the clamp mechanism 12. While the clamp mechanism 12 is performing a vertical positioning, the protruding portions 13C are picked up and then fixed by the clamp mechanism 12. In this manner, the process for installing the probe card at the probe device 10 is completed. At this time, the inner ring 18 is installed at the insert ring 14.

As described above, in accordance with this embodiment, the probe card 17 is provided with the primary card holder 13 whose diameter is greater than an outer diameter of the exclusive card holder 20 and the conversion ring 16 for guiding a connection between the card holder 20 and the primary card holder 13 in installing the probe card 17 at the primary card holder 13. Therefore, plural kinds of probe cards 17 can be installed at the primary card holder 13 via the conversion ring 16 corresponding to card holders 20 and; further, the exclusive probe cards 17 can be installed at plural kinds of testers. The primary card holder 13 can be used for the probe cards whose diameters are acceptable to the primary card holder 13. Further, by using the primary card holder 13 itself as a card holder of a probe card, the primary card holder 13 can be used for a scaled up probe card.

Only by manipulating the pressing members 21A of the one-touch fixing mechanisms 21 provided at the conversion ring 16, the probe card 17 can be attached to and detached from the conversion ring 16 with a one-touch operation.

Figure 5:
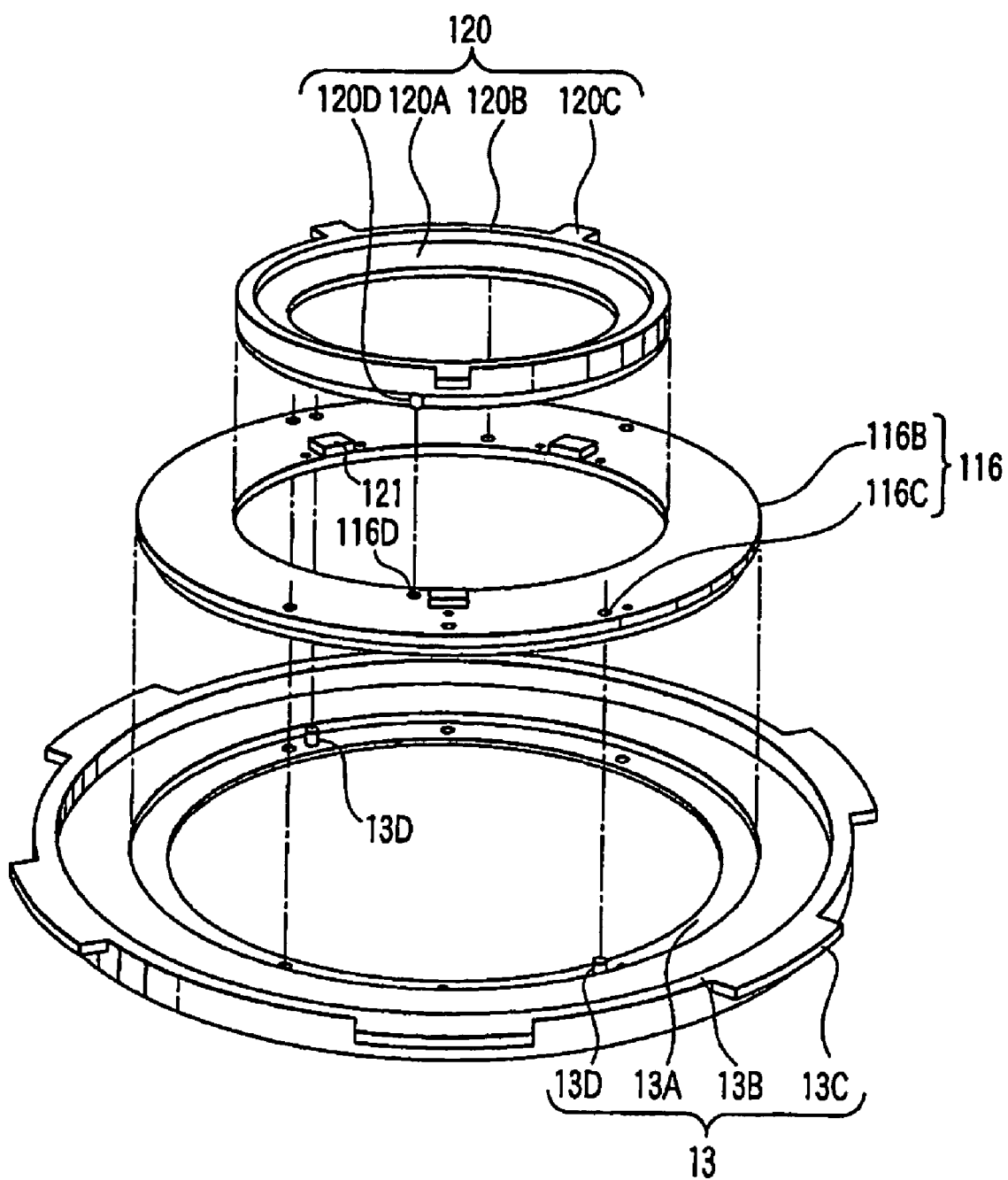
FIG. 5 presents a perspective view of principal parts of a probe device in accordance with another preferred embodiment of the present invention.

FIGS. 5 to 7 illustrate principal parts of a probe device in accordance with another preferred embodiment of the present invention. A probe device 10 of this embodiment can employ the same configuration as that of the probe device of the aforementioned embodiment except that there are provided a card holder, a conversion ring and an inner ring for installing a different type of probe card. Therefore, a card holder, a conversion ring and an inner ring different from those of the aforementioned embodiment are used in this embodiment.

Figure 7A:
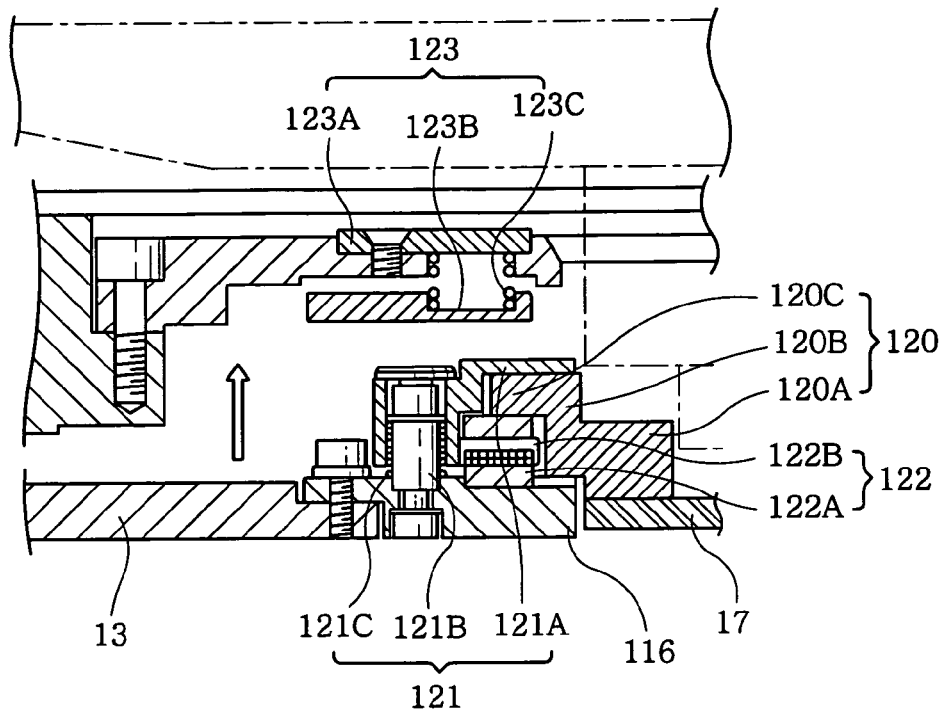
FIG. 7A shows a sectional view depicting a state right before a card holder of FIG. 5 is fixed to a primary card holder.
Figure 7B:
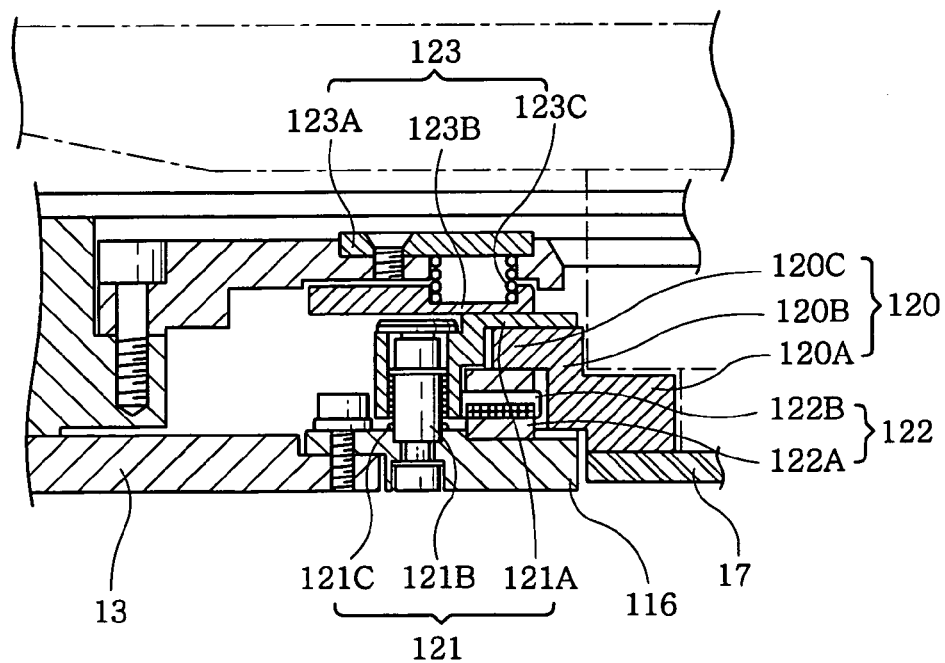
FIG. 7B describes a sectional view illustrating a state where the card holder of FIG. 5 is fixed to the primary card holder.
Figure 8:
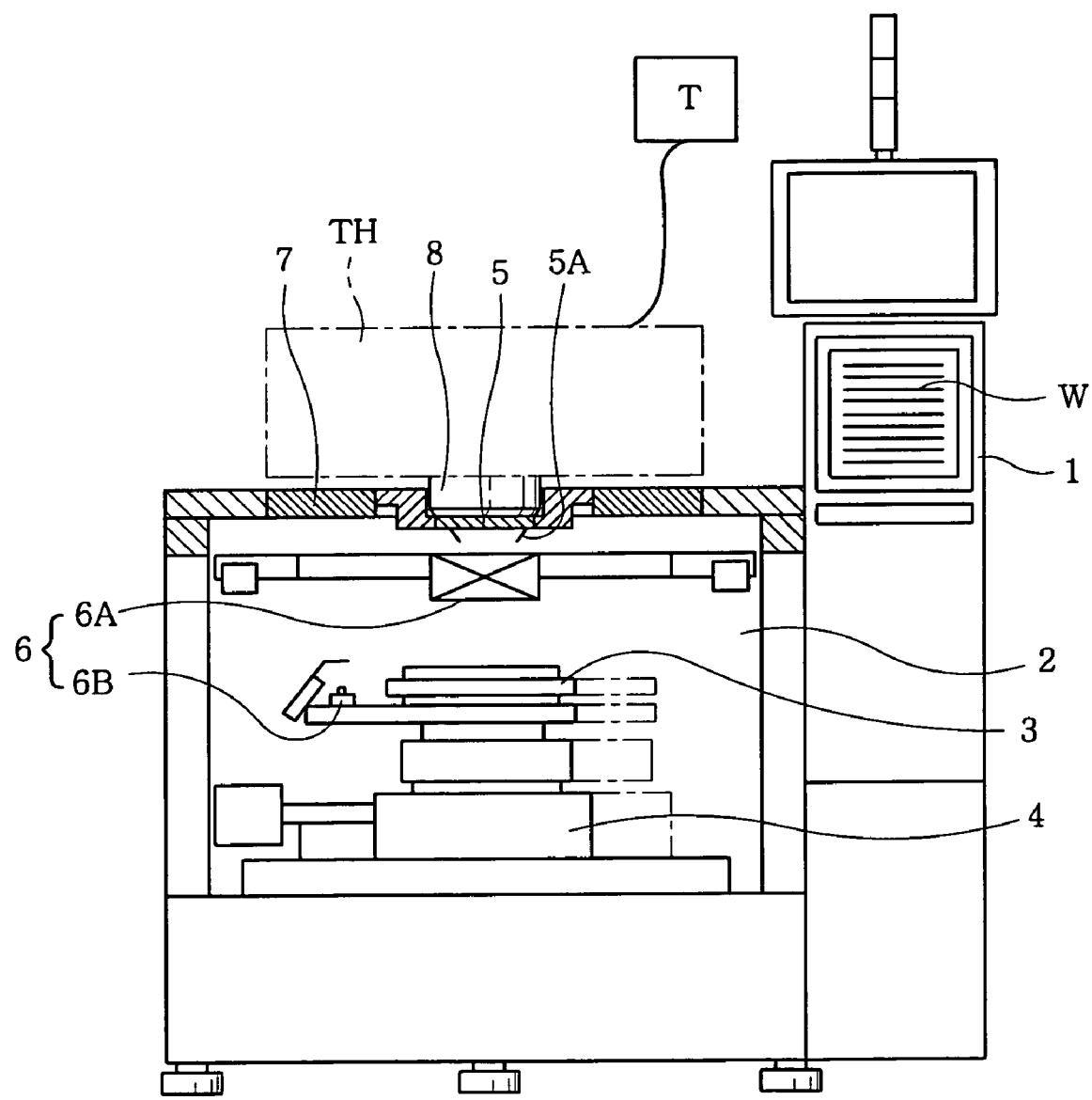
FIG. 8 is a partially cutaway cross sectional view of a conventional probe device.

A probe card (not shown) used in this embodiment is installed at the probe device 10 by a card holder 120 illustrated in FIGS. 5, 7A and 7B. As shown in FIG. 5, the card holder 120 can have a ring-shaped structure. Further, as can be seen from FIGS. 7A and 7B, the card holder 120 can include: a receiving portion 120A for receiving a backside of an outer peripheral portion of the probe card; a wall 120B upwardly extending from the outer peripheral portion of the receiving portion 120A; a plurality of (e.g., three in this embodiment) radial protruding portions 120C spaced apart from each other at regular intervals along an upper circumferential direction of the wall 120B; and two protrusions 120D formed on a lower surface of the wall 120B so as to be aligned with the conversion ring 116. Further, during the inspection, the card holder 120 can be fixed to a pogo pin (not shown) side by a suction force. Herein, the two protrusions 120D can be spaced apart from each other at 180 degrees along a circumferential direction.

As depicted in FIG. 5, the conversion ring 116 can be formed as a ring-shaped plate whose inner diameter refers to a size which enables the wall 120B of the card holder 120 to be insertion-fitted thereinto and the protruding portions 120C to be engaged therewith. A flange portion 116B formed at an upper portion of an outer peripheral surface of the conversion ring 116 is engaged with the receiving portion 13A of the primary card holder 13. Further, two positioning recesses 116D corresponding to the protrusions 120D of the card holder 120 can be formed at an inner peripheral portion of the conversion ring 116. By inserting the protrusions 120D into the recesses 116D, the card holder 120 is aligned with the conversion ring 116. Moreover, three one-touch fixing mechanisms 121 can be installed at an inner peripheral portion of a top surface of the conversion ring 116 to be aligned with the protruding portions 120C of the card holder 120.

Hereinafter, the one-touch fixing mechanisms 121 will be described with reference to FIGS. 6 and 7. Each of the one-touch fixing mechanisms 121 can include: a pressing member 121A for pressing the protruding portion 120C of the card holder 120; and an upright axial member 121B installed at an inner peripheral portion of the conversion ring 116 through a collar formed at one end portion of the pressing member 121A. Further, protrusions are formed at an approximately intermediate portion of an inner peripheral surface of the collar of the pressing member 121A along an entire peripheral direction. A coil spring 121C is installed between the protrusions and the top surface of the conversion ring 116, and constantly pressurizes the pressing member 121A in an upward direction. Furthermore, the pressing member 121A is elastically contacted with a flange portion of the axial member 121B. Moreover, two vertical grooves (not shown) spaced apart from each other at 180 degrees are formed on an outer peripheral surface of the collar along the circumferential direction. A direction of the pressing member 121A can be determined by the grooves, as will be described later.

Figure 6A:
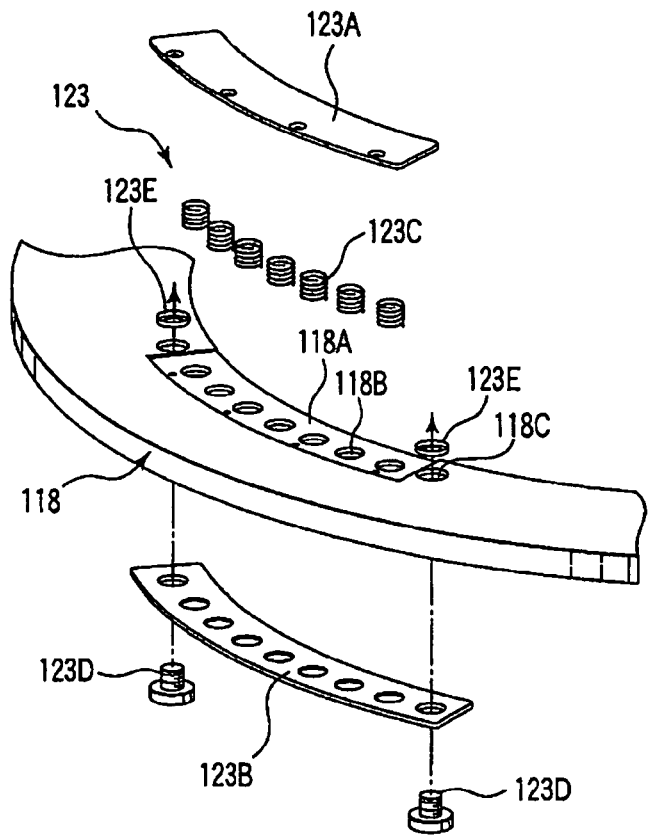
FIG. 6A offers an exploded perspective view of an inner ring corresponding to a conversion ring shown in FIG. 5.
Figure 6B:
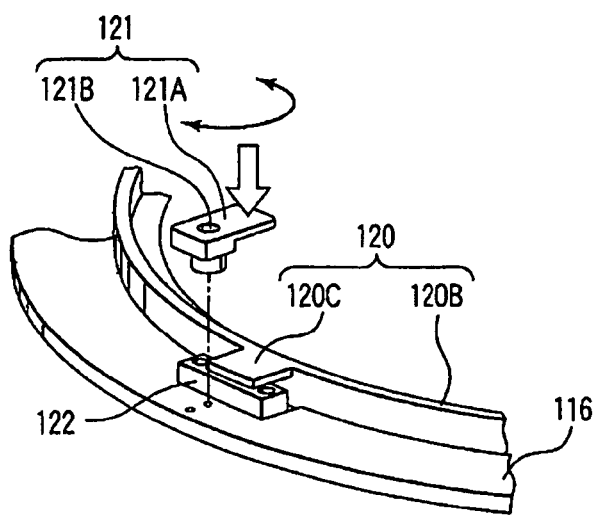
FIG. 6B provides an exploded perspective view of principal parts of the conversion ring of FIG. 5.

As depicted in FIG. 6B, first positioning mechanisms 122 can be provided near the respective axial members 121B. Further, as shown in FIGS. 6B, 7A and 7B, each of the first positioning mechanisms 122 can include: a rectangular block body 122A fixed to an inner peripheral portion of the conversion ring 116; and a ball plunger 122B mounted toward a diametric direction of the conversion ring 116 in the block body 122A. Further, a direction of the pressing members 121A is determined by inserting leading ends of the ball plungers 122B into the grooves formed on the outer peripheral surfaces of the collars of the pressing members 121A. Therefore, the pressing members 121A can slightly move along the grooves in a vertical direction.

As illustrated in FIGS. 6A, 7A and 7B, the inner ring 118 can be provided with three second positioning mechanisms 123. The second positioning mechanisms 123 can be disposed at locations corresponding to the one-touch fixing mechanisms 121 of the conversion ring 116. Further, the second positioning mechanisms 123 perform a vertical (in Z-direction) positioning of the probe card.

As depicted in FIG. 6A, for example, the second positioning mechanisms 123 can be formed in an arc shape. Further, each of the second positioning mechanisms 123 include: a pair of flat bars 123A and 123B respectively attached to a top and a bottom surface of the inner ring 118; a plurality of (seven in this embodiment) coil springs 123C elastically installed between the upper and the lower flat bar 123A and 123B, as will be described later; and a pair of guide pins 123D having heads, for connecting the lower flat bar 123B with the inner ring 118 at both ends of the lower flat bar 123B so that the lower flat bar 123B can move vertically. The upper flat bar 123A is shorter than the lower flat bar 123B and thus can be screw-fixed to a shallow recess portion 118A of the inner ring 118 at a plurality of locations. Since the probe card is sucked toward the pogo ring side, the number of coil springs 123C needs to be properly set according to a suction force of the probe card.

Besides, as illustrated in FIGS. 6A, 7A and 7B, seven first through holes 118B spaced apart from each other at regular intervals can be formed at the recess portion 118A of the inner ring 118 along a circumferential direction of the inner ring 118. The coil springs 123C are elastically installed between the upper flat bar 123A and the lower flat bar 123B through the through holes 118B. Further, the second through holes 118C can be formed at an outer portion of a circumferential direction of the recess portion 118A of the inner ring 118. The guide pins 123D penetrate those through holes 118C. Furthermore, upper ends of the guide pins 123D are screwed with the second through holes 118C of the inner ring 118 via a washer 123E. At this time, a gap is formed between the heads of the guide pins 123D and a bottom surface of the inner ring 118. In such gap, the lower flat bar 123B can vertically move against an elastic force of the coil springs 123C. Further, the lower flat bar 123B can be provided with seven recess portion to prevent a misalignment of the coil springs 123C.

In case the probe card of this embodiment is installed at the probe device 10, first of all, the probe card (not shown) is installed at the card holder 120 shown in FIG. 5 and, then, the card holder 120 is installed at the conversion ring 116 so that the protrusions 120D of the card holder 120 can be aligned with the recesses 116D of the conversion ring 116. As a result, the protruding portions 120C of the card holder 120 face the one-touch fixing mechanisms 121 of the conversion ring 116. By lifting and rotating the pressing members 121A of the one-touch fixing mechanisms 121, the leading ends of the ball plungers 122B of the first positioning mechanisms 122 are separated from the grooves of the collars of the pressing members 121A. Thereafter, as shown in FIG. 7A, the leading ends of the ball plungers 122B are inserted into the grooves of the collars by rotating the pressing members 121A and, then, the pressing members 121A are positioned toward a diametric direction of the conversion ring 116. Next, the card holder 120 is fixed on the conversion ring 116. In such stage, as shown in FIG. 7A, there is a minute clearance space between the pressing members 121A and the protruding portions 120C of the card holder 120 due to a pressuring force of the coil springs 121C.

As depicted in FIG. 5, the positioning holes 116C of the conversion ring 116 are aligned with the positioning protrusions 13D of the primary card holder 13. Then, the conversion ring 116 and the primary card holder 13 are clamped by screws. Next, a probe card is transferred directly under the clamp mechanism 12 by the card holder transfer mechanism (not shown). As indicated by an arrow of FIG. 7A, the probe card is lifted and, then, the protruding portions 13C of the primary card holder 13 are insertion-fitted into the clamp mechanism 12. While the clamp mechanism 12 is performing a vertical positioning, the protruding portions 13C are picked up and then fixed.

At this time, as described in FIG. 7B, the pressing members 121A of the one-touch fixing mechanisms 121 are elastically contacted with the lower flat bars 123B of the second positioning mechanisms 123. By pressurizing the protruding portions 120C of the card holder 120 with the pressing members 121A, the card holder 120 is fixed on the conversion ring 116. With an elevation of the primary card holder 13, the flat bars 123B are lifted against an elastic force of the coil springs 123C and, also, the probe card is positioned at a specific Z location, thereby installing the probe card at the probe device 10. At this time, the inner ring 118 is installed at the insert ring 14. Meanwhile, the probe card can be detached by reversing the installation process.

As described above, in accordance with this embodiment, even when types of testers or probe cards are changed, the same effects of the aforementioned embodiments can be achieved by changing the inner ring 18 and/or the conversion ring 16 according to the testers and the probe cards.

The present invention, which is not limited to the aforementioned embodiments, enables a probe device to be used for plural kinds of testers by using various inner rings and conversion rings according to the testers.

The present invention is suitable for a probe device.

While the invention has been shown and described with respect to the preferred embodiments, it will be understood by those skilled in the art that various changes and modification may be made without departing from the scope of the invention as defined in the following claims.

What is claimed is:

1. A probe device comprising:
   a tester;
   a probe card;
   a base card holder;
   an auxiliary card holder for mounting the probe card thereon to adaptively accommodate the probe card to the base card holder; and
   a conversion ring for mounting the auxiliary card holder thereon to allow the auxiliary card holder to be fitted to the base card holder,
   wherein the conversion ring is mounted on the base card holder, and
   wherein the base card holder is configured to accommodate any one of selected different conversion rings and the conversion ring is the one chosen from the different conversion rings according to the probe card.

2. The probe device of claim 1, wherein the auxiliary card holder includes protrusions formed therearound, and the conversion ring includes one-touch fixing mechanisms for fixing at least parts of the protrusions of the auxiliary card holder.

3. The probe device of claim 2, wherein each of the one-touch fixing mechanisms has a pressing member for pressing a corresponding protrusion and an axial member for supporting the pressing member to rotate freely.

4. The probe device of claim 3, wherein each of the one-touch fixing mechanisms further has an elastic member for pressurizing the pressing member in a downward direction.

5. The probe device of claim 3, wherein each of the one-touch fixing mechanisms further has positioning mechanisms for determining a position where the pressing member is fixed.

6. The probe device of claim 5, wherein the positioning mechanisms are a pair of positioning protrusions which are attached to bottom surfaces of two opposite end portions of the pressing member.

7. The probe device of claim 2, wherein the protrusions are radially formed on an outer peripheral surface of the auxiliary card holder.

8. The probe device of claim 1, further comprising:
   a connecting ring for electrically connecting the tester with the probe card;
   an insert ring; and
   an inner ring for adaptively mounting the connecting ring to the insert ring,
   wherein the insert ring is configured to accommodate any one of selected different inner rings and the inner ring is the one chosen from the different inner rings according to the connecting ring.

9. The probe device of claim 8, wherein the inner ring includes a positioning mechanism for vertically positioning the probe card used in the tester.

10. The probe device of claim 1, wherein the auxiliary card holder is mounted directly to the conversion ring, and the conversion ring is mounted directly to the base card holder.

11. The probe device of claim 10, wherein the auxiliary card holder is mounted to a receiving portion on a first side of the conversion ring, and a flange portion on a second side of the conversion ring is mounted to a receiving portion of the base card holder.

12. The probe device of claim 11, wherein a portion of the second side of the conversion ring is substantially coplanar with at least a portion of corresponding sides of the auxiliary card holder and the base card holder.

* * * * *